(12) United States Patent
Takeichi et al.

(10) Patent No.: US 6,258,723 B1
(45) Date of Patent: Jul. 10, 2001

(54) DRY ETCHING METHOD AND A TFT FABRICATION METHOD

(75) Inventors: Masatomo Takeichi, Shiga-ken; Hiroaki Kitahara, Ohtsu, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/271,720

(22) Filed: Mar. 18, 1999

(51) Int. Cl.[7] .................................................. H01L 21/302
(52) U.S. Cl. .................................... 438/706; 438/149
(58) Field of Search ........................................ 438/149, 158, 438/159, 162, 689, 706, 712, 713, 714

(56) References Cited

U.S. PATENT DOCUMENTS

| | | | |
|---|---|---|---|
| 5,017,983 | * 5/1991 | Wu | 357/23.7 |
| 5,516,712 | * 5/1996 | Wei et al. | 437/40 |
| 5,998,229 | * 12/1999 | Lyu et al. | 438/30 |
| 6,104,042 | * 8/2000 | Sah | 257/59 |

FOREIGN PATENT DOCUMENTS

| | | | | |
|---|---|---|---|---|
| 1-274431 | 11/1989 | (JP) | | H01L/21/302 |
| 4-96223 | 3/1992 | (JP) | | H01L/21/302 |
| 6-177083 | 6/1994 | (JP) | | H01L/21/302 |

* cited by examiner

Primary Examiner—David Nelms
Assistant Examiner—Quoc Hoang
(74) Attorney, Agent, or Firm—Robert M. Trepp

(57) ABSTRACT

A method for etching a hydrogenated amorphous silicon layer and a metal layer formed thereon in a dry etching tool, is described incorporating the steps of selectively etching the metal layer on the hydrogenated amorphous silicon layer and etching the hydrogenated amorphous silicon layer. The invention overcomes the problem of performing sequential dry etching of a metal layer and a hydrogenated amorphous silicon underlayer in a single etching tool.

13 Claims, 5 Drawing Sheets

DRY ETCHING METHOD AND A TFT FABRICATION METHOD

FIELD OF THE INVENTION

The present invention relates to a dry etching method, and in particular to a dry etching method used in a thin-film transistor (TFT) fabrication process for a liquid crystal display.

BACKGROUND OF THE INVENTION

Generally, in semiconductor fabrication processing, to provide metal wiring on a silicon layer, including a hydrogenated amorphous silicon layer (a-Si:H) or on an isolation or insulation layer, a metal wiring layer on an underlayer must be selectively etched. If not otherwise specified, the "a-Si:H layer" in this specification is composed of a non-doped amorphous layer, a doped amorphous layer or both.

For example, in the procedures for fabricating a thin-film transistor (TFT) employed for a liquid crystal display (LCD), that has the structure shown in FIG. 1, a metal wiring layer 2 on an n type a-Si:H layer 1, which is an underlayer, must be selectively etched. The TFT in FIG. 1 is a so-called reverse staggered TFT, a gate electrode 6 wherefore is formed under an a-Si:H active layer (a channel layer) 4 on a substrate 7.

Wet etching is normally employed to selectively etch the metal layer 2. As one reason for this, in the dry etching process, when the metal layer is etched, etching of the underlayer also occurs, so that a so-called under-cut will be formed in the n type a-Si:H layer 1, and etching of an i-stopper layer 3 and a gate isolation or insulation layer 5 formed under it will also occur. The i-stopper layer 3 is an isolation or insulation layer, for example, a silicon nitride layer formed between the source and the drain of the a-Si:H active layer 4 in order to prevent current leakage between the source and the drain while TFT is off. Another reason wet etching is employed in the prior art is that when using the dry etching process it is difficult to form the tapered end or edge that is required for the metal wiring, and specifically, the range is very narrow within which etching conditions can be established that satisfy both the requirement for selective etching and the requirement for a tapered wiring end or edge.

On the other hand, the dry etching method is employed to etch the n type a-Si:H layer 1 and the a-Si:H active layer 4, which are underlayers for the metal layer 2. One of the reasons for this is that a dry etching method for selectively etching the n type a-Si:H layer 1 on the i-stopper layer 3 and a dry etching method for selectively etching the a-Si:H active layer 4 on the gate isolation layer 5 are commonly established.

As is described above, in the fabrication processing for TFT shown in FIG. 1, conventionally, wet etching must be employed to etch the metal wiring layer 2, and the dry etching must be employed to etch the n type a-Si:H layer 1 and the a-Si:H active layer 4, which are the underlayers for the metal layer 2. In other words, two different devices or tools, a wet etching tool and a dry etching tool, are required. Therefore, after the metal layer 2 has been etched, a substrate 7 must be removed from the wet etching device and then be set up in the dry etching device for the etching of the a-Si:H layers 1 and 4. Since the substrate 7 comes into contact with the external atmosphere under normal atmospheric pressure, dust and impurities may attach themselves to its surface. In addition, the etching period is extended because the substrate must be loaded and unloaded twice and must be transported between the devicesor tools.

These problems can be resolved by etching the metal layer 2 first and then etching the a-Si:H layers 1 and 4 in the same dry etching device.

Described in Japanese Unexamined Patent Publication No. Hei 6-291314 is a TFT fabrication method whereby, in a plasma etching device, a gate isolation layer is etched under the same conditions as those under which a molybdenum metal layer (a gate electrode layer) is etched. The purpose of this method, however, is the etching of a gate isolation layer made of silicon nitride, and not the selective etching of a metal layer on an a-Si:H underlayer.

It is, therefore, one object of the present invention to provide a dry etching method whereby a metal layer and an a-Si:H underlayer are sequentially etched in a single etching device.

It is another object of the present invention to provide a dry etching method whereby a metal wiring layer on an a-Si:H underlayer can be selectively etched, and the end, sidewall or edge of the metal wiring layer can be tapered as required.

It is an additional object of the present invention to provide a dry etching method, used for a fabrication method for a TFT employed for a liquid crystal display, whereby a metal wiring layer on an a-Si:H underlayer can be selectively etched, and the end of the metal wiring can be tapered.

SUMMARY OF THE INVENTION

In accordance with the present invention, a method for etching in a dry etching device a hydrogenated amorphous silicon layer and a metal layer formed thereon is described comprising the steps of: selectively etching the metal layer on the hydrogenated amorphous silicon layer; and etching the hydrogenated amorphous silicon layer.

Furthermore, according to the present invention, a TFT fabrication method employing the above selective etching method is provided.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

A reverse staggered TFT fabrication method for a Liquid Crystal display (LCD) according to one embodiment of the present invention will now be described while referring to FIGS. 2 to 7.

Figure 1:
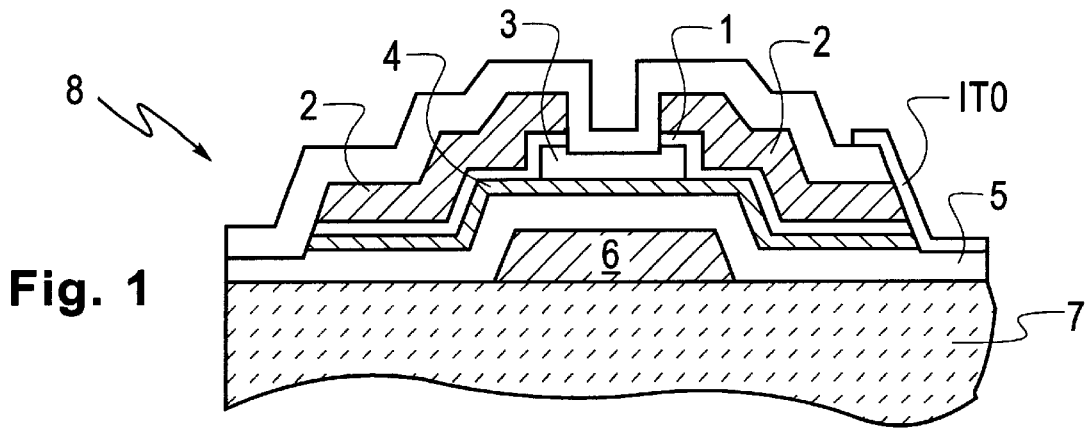
FIG. 1 is a diagram illustrating the structure of a reverse staggered TFT for use in an LCD.
Figure 2:
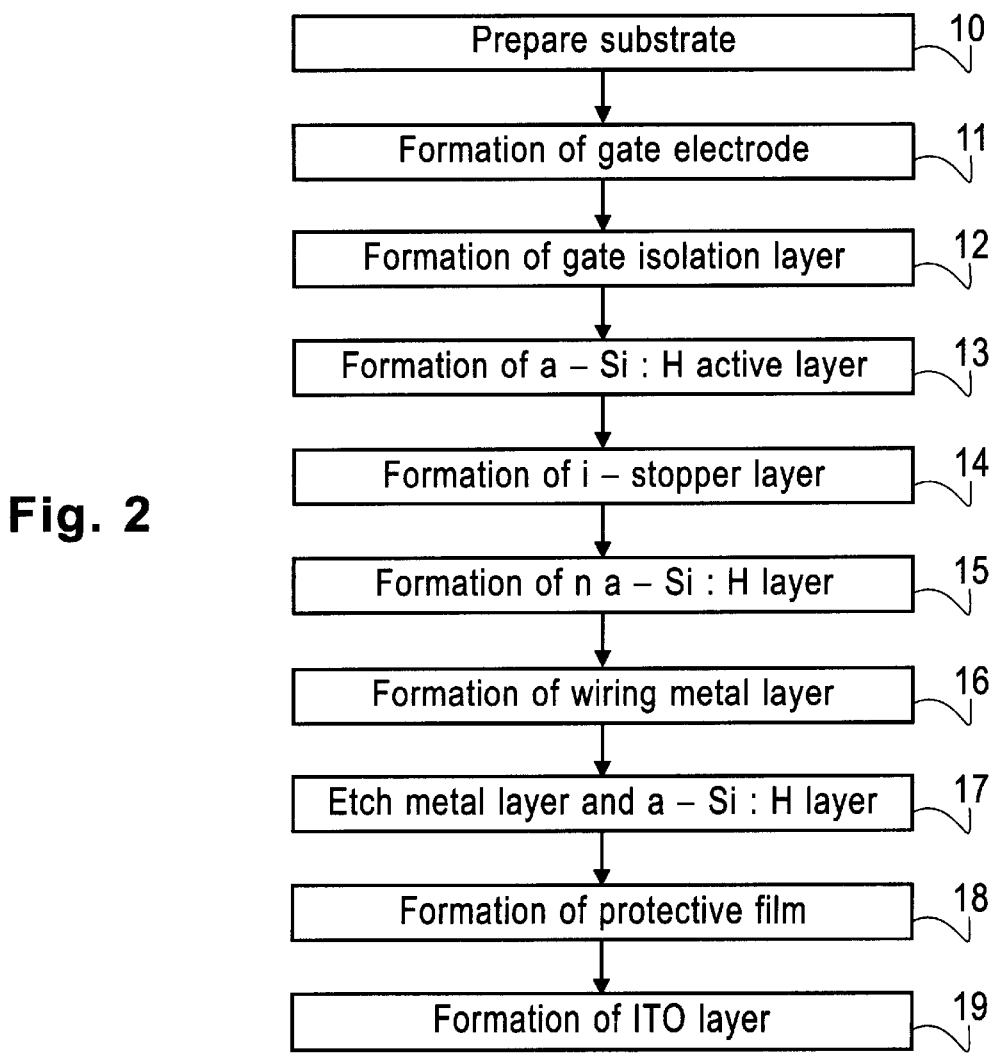
FIG. 2 is a diagram showing the processing for fabricating a reverse staggered TFT for an LCD according to one embodiment of the present invention.
Figure 3:
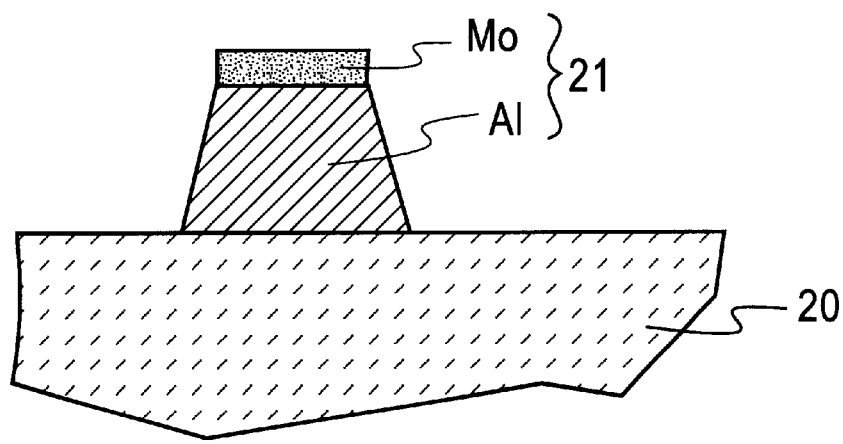
FIG. 3 is a diagram showing one step of the reverse staggered TFT fabrication process according to the embodiment of the present invention.

FIG. 2 is a flowchart showing the TFT fabrication method according to the present invention. At step 10, a washed glass substrate is prepared, and at step 11 a gate electrode is formed. The gate electrode is provided by sputtering Al and Mo onto the substrate and by patterning the sputtered layer on the substrate using an ordinary photolithographic process (resist coating, exposing and developing) and an etching process. Al may be replaced by tungsten (W), and either wet etching or dry etching may be employed. During the etching process, tapering at a predetermined angle of the Al sidewalls or edges is performed. In FIG. 3 is shown a substrate 20 on which a gate electrode 21 is formed at step 11. The gate electrode 21 comprises an aluminum (Al) layer and a molybdenum (Mo) layer.

Figure 4:
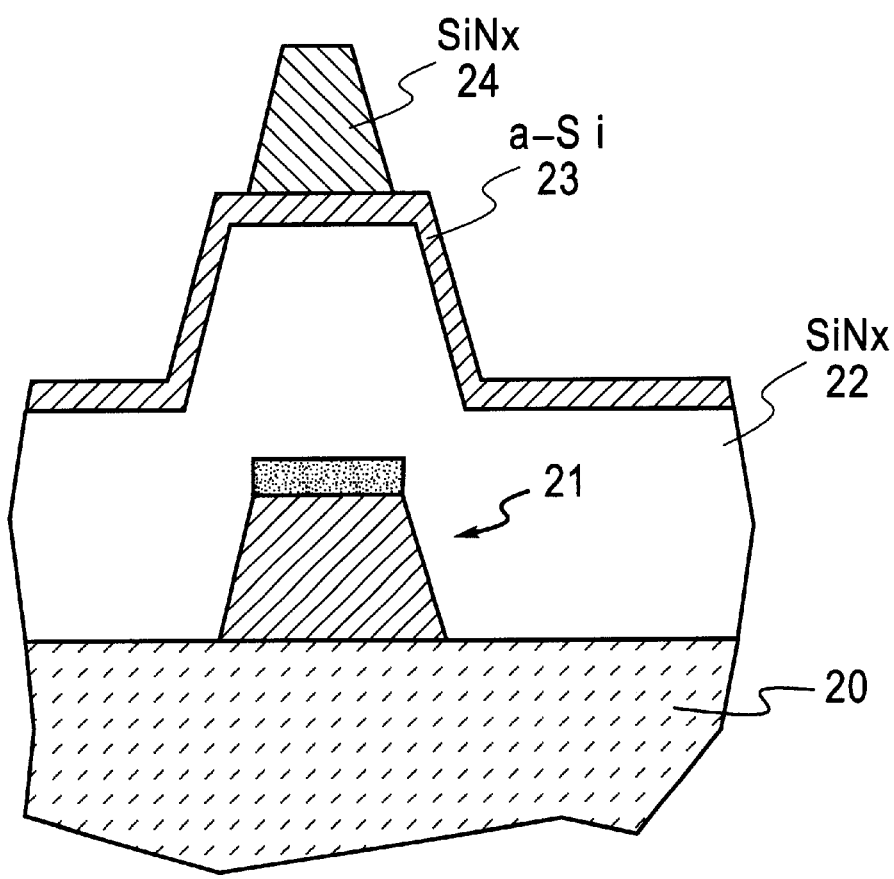
FIG. 4 is a diagram showing one step of the reverse staggered TFT fabrication process according to the embodiment of the present invention.

At step 12 in FIG. 2, a silicon nitride layer 22, which serves as a gate isolation layer, is formed on substrate 20 in FIG. 3 using a Chemical Vapor Deposition (CVD) method. At step 13, using the CVD method, an a-Si:H active layer 23 is formed on gate isolation layer 22. At step 14, again using the CVD method, a silicon nitride layer 24 that serves as an i-stopper layer is formed on a-Si:H layer 23. In addition, at step 14 only the silicon nitride layer 24 is patterned using the ordinary photolithography and etching. FIG. 4 is a diagram illustrating substrate 20 obtained at step 14. In FIG. 4, a gate isolation layer 22 and an a-Si:H active layer 23 are formed on the gate electrode 21, and a patterned i-stopper layer 24 is formed on the a-Si:H active layer 23. The i-stopper layer 24 is provided to prevent the occurrence of current leakage between the source and the drain of the TFT while the TFT is off.

Figure 5:
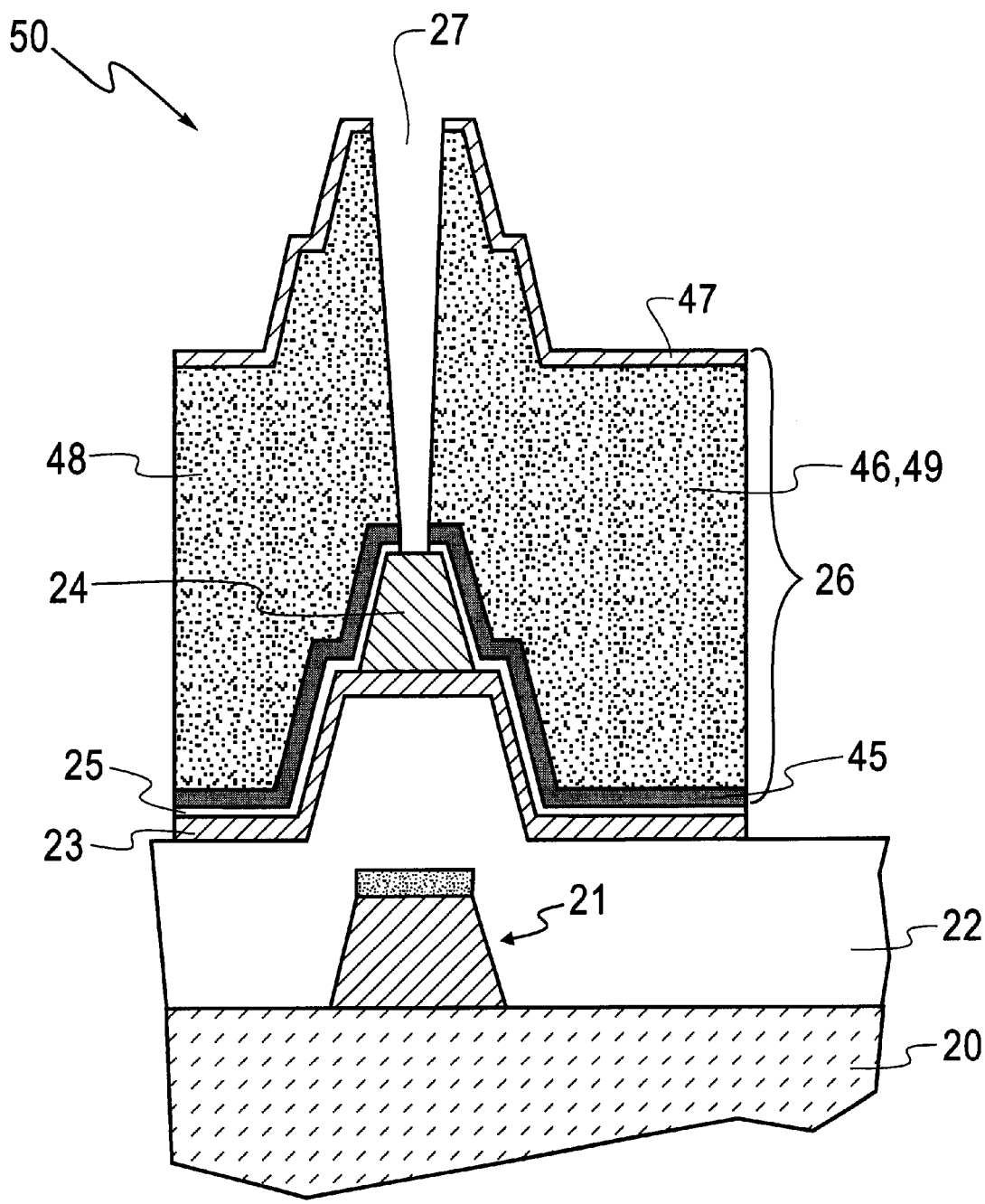
FIG. 5 is a diagram showing one step of the reverse staggered TFT fabrication process according to the embodiment of the present invention.

At step 15 in FIG. 2, using the CVD method, an n type a-Si:H layer 25 that serves as a doping layer is formed on the substrate 20 shown in FIG. 5. It should be noted that to fabricate a p-channel TFT, a p type a-Si:H layer is formed instead of the n type a-Si:H layer. At step 16, a metal wiring layer 26 containing molybdenum (Mo) is formed by sputtering the layer onto the substrate 20 on which the n type a-Si:H layer 25 is deposited. At step 17, the metal layer 26 is first etched using a predetermined pattern. At this time, a patterned resist layer for use as a mask is formed on metal layer 26 using ordinary photolithography, and a reactive ion etching method is used for the etching. The etching process must be performed under the same conditions under which metal layer 26 on n type a-Si:H 25 underlayer is selectively etched and a required tapered shape is formed at the ends, sidewalls or edges of metal wiring 26. These conditions are, for example, as follows.

The etching conditions for metal layer 26 include a flow rate of a chlorine containing gas or bromine containing gas of 100 to 500 SCCM, a flow rate for oxygen of 30 to 150 SCCM, a flow rate of helium gas or argon gas of 100 to 500 SCCM, a pressure of 20 to 400 mTorr, and a radio-frequency (RF) power density in the range from 0.5 to 1.0 W/Cm².

Under these conditions, etching can be performed with a Mo etching speed of approximately 100 nm/min, a plane uniformity of Mo etching speed of ±10%, and a selection ratio of Mo to a-Si:H layer of 3 or greater. An angle of 45â±25â can be obtained for the taper at the end, sidewall or edge of the Mo layer.

At step 17 in FIG. 2, n type a-Si:H layer 25 and a-Si:H active layer 23 are etched using the reactive ion etching device employed for etching metal layer 26. In other words, the etching is performed using a mask such as a photoresist layer that was employed to etch the metal layer 26 under different etching conditions. In this case, etching takes place under the following conditions.

The a-Si:H layer 23 etching conditions comprise a flow rate of hexafluoride ($SF_6$) gas of 200 SCCM, a flow rate of chlorine containing gas of 300 SCCM, a flow rate of helium of 300 SCCM, a pressure of 200 mTorr, and a radio-frequency (RF) power density of 0.5 W/cm².

Under these conditions, the etching can be performed with an a-Si:H layer etching speed of approximately 400 nm/min or higher, a plane uniformity of a-Si:H layer etching speed of ±10%, a selection ratio of an a-Si:H layer to a silicon nitride under layer of 10 or greater.

FIG. 5 is a diagram illustrating the substrate 20 obtained at step 17. In FIG. 5, a metal wiring layer 26 on an n type a-Si:H layer 25 is constituted by three layers comprising Mo layer 45, Al layer 46 and Mo layer 47. An opening 27 formed in the metal wiring layer 26 reaches the top of the i-stopper layer 24, and the metal side walls of the opening serve as the source electrode 48 and the drain electrode 49 of TFT 50.

Figure 6:
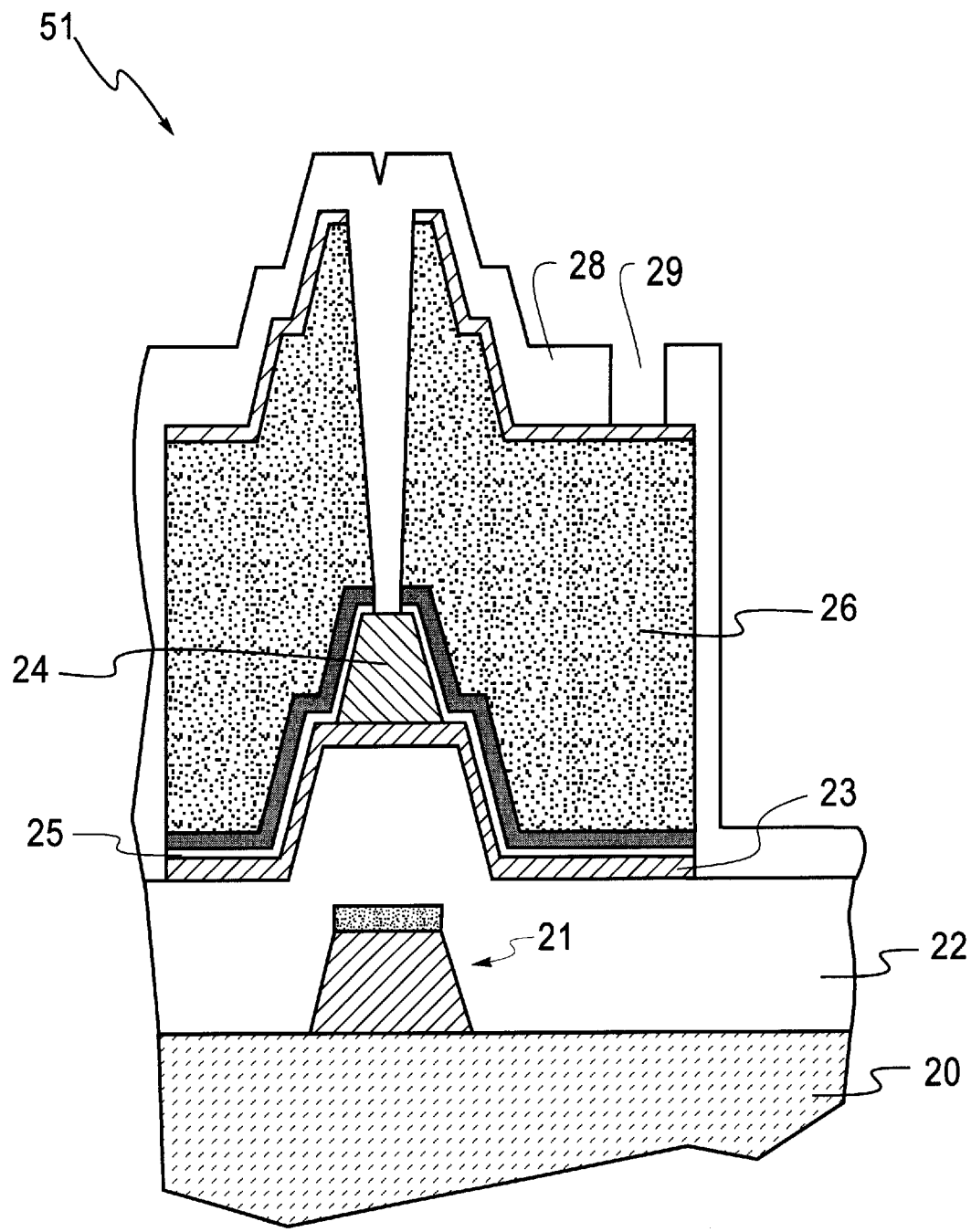
FIG. 6 is a diagram showing one step of the reverse staggered TFT fabrication process according to the embodiment of the present invention.

At step 18 in FIG. 2, a silicon nitride protective layer 28 is formed on TFT 50 shown in FIG. 6 using the CVD method. Protective layer 28 is patterned using ordinary photolithography and etching processes. FIG. 6 is a diagram illustrating TFT 51 obtained at step 18. Silicon nitride layer 28 has an opening 29 formed for an electrical connection.

Figure 7:
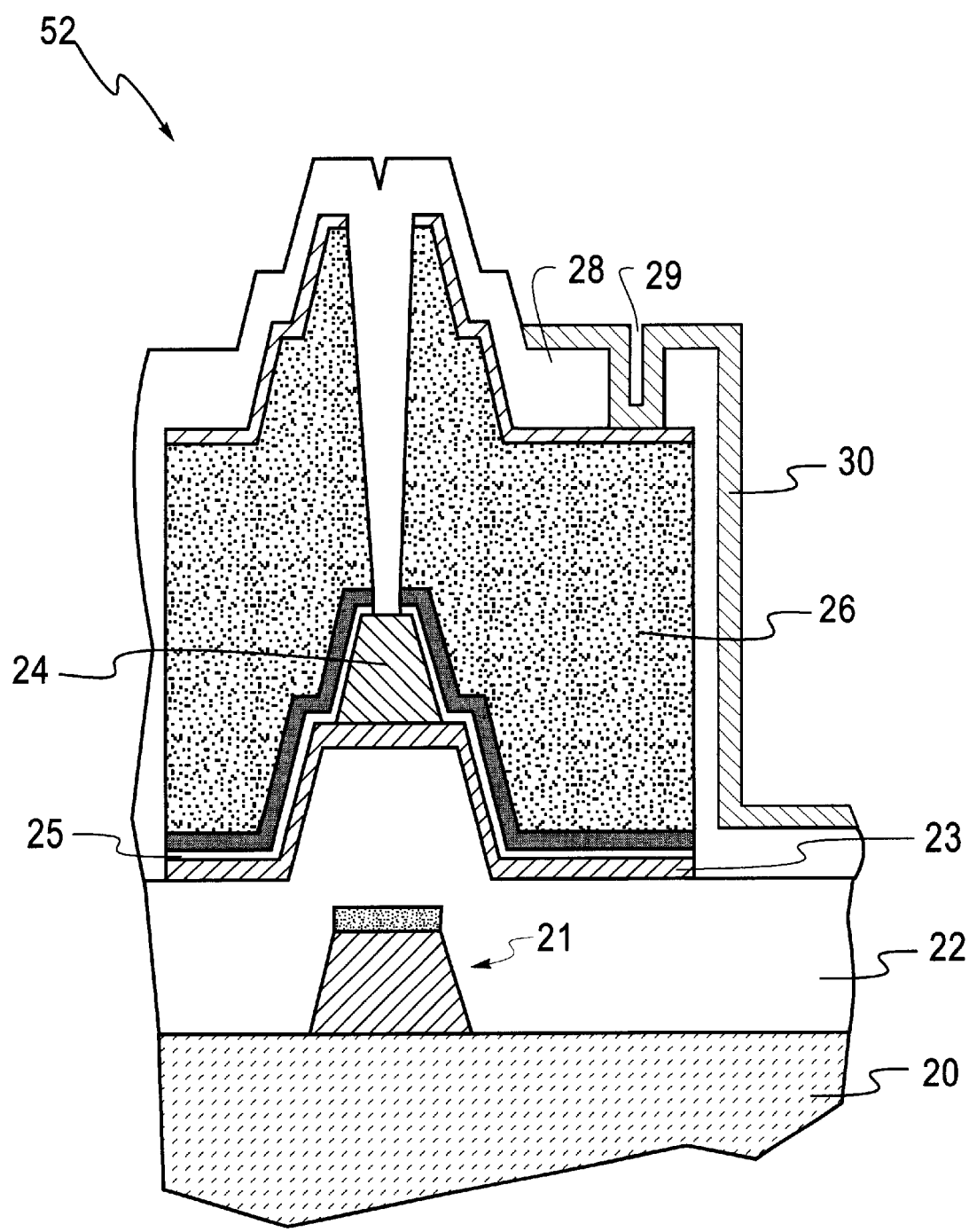
FIG. 7 is a diagram showing the final step for the reverse staggered TFT fabrication process according to the embodiment of the present invention.

At step 19 in FIG. 2, sputtering is used to form an indium tin oxide (ITO) layer that serves as a transparent electrode layer 30 on TFT 51 in FIG. 6. FIG. 7 is a diagram showing TFT 52 obtained at step 19. The ITO layer 30 is electrically connected to the metal layer 26 along the opening 29. Therefore, TFT 52 is finally completed.

The present invention has been explained by employing a process for fabricating a TFT for use in an LCD. However, the present invention is not limited to the above embodiment, and can be applied for the dry etching of a combination consisting of an a-Si:H layer and a metal layer. The dry etching in this invention includes not only the above described reactive ion etching, but also other types of dry etching methods, such as common plasma etching (anode coupling) and Electron Cyclotron Resonance (ECR) etching.

In addition, according to the present invention, a metal wiring layer on an a-Si:H underlayer can be selectively etched in a single etching device, and a required tapered shape can be formed at the ends, sidewalls or edges of the metal wiring layer.

What is claimed is:

1. A method for etching, in a dry etching device, a hydrogenated amorphous silicon layer and a metal layer formed thereon comprising the steps of:

selectively etching said metal layer on said hydrogenated amorphous silicon layer, and etching said hydrogenated amorphous silicon layer, said metal layer containing molybdenum, said hydrogenated amorphous silicon layer includes an undoped hydrogenated amorphous silicon layer and a doped hydrogenated amorphous silicon layer formed theron, said step of selectively etching said metal layer includes the step of, while etching, tapering at an angle side walls of said metal layer.

2. The dry etching method according to claim 1, in which said step of selectively etching said metal layer includes a reactive ion etching step employing as reactive gases a chlorine containing gas and oxygen.

3. The dry etching method according to claim 1, in which said step of selectively etching said metal layer includes a reactive ion etching step employing as reactive gases a bromine containing gas and oxygen.

4. The dry etching method according to claim 1, in which said step of selectively etching said metal layer includes a step of etching said metal layer on said hydrogenated amorphous silicon layer at a ratio equal to or greater than 3 to 1.

5. The dry etching method according to claim 1, in which said angle of said tapering is substantially 45â±25â.

6. The dry etching method according to claim 1, in which said step of selectively etching said metal layer includes the step of performing etching under the following conditions:
   flow rate of a gas selected from the group consisting of chlorine containing gas
   and bromine containing gas of 100 to 500 SCCM, a flow rate of oxygen of 30 to
   150 SCCM, a flow rate of a gas selected from the group consisting of helium and
   argon of 100 to 500 SCCM, a pressure of 20 to 400 mTorr, and a radiofrequency
   (RF) power density in the range from 0.5 to 1.0 W/cm$^2$.

7. A method for fabricating a thin-film transistor (TFT) comprising the steps of:
   preparing a substrate;
   forming a gate electrode on said substrate;
   depositing a hydrogenated amorphous silicon active layer on said gate isolation layer;
   forming a first isolation layer on said hydrogenated amorphous silicon active layer on said gate electrode;
   depositing a doped hydrogenated amorphous silicon layer on said hydrogenated amorphous silicon active layer and said first isolation layer;
   forming a metal layer on said doped hydrogenated amorphous silicon layer; and
   etching said metal layer, said doped hydrogenated amorphous silicon layer, and said hydrogenated amorphous silicon active layer using a predetermined photo-mask, said etching step whereof includes the steps of selectively etching in a dry etching device said metal layer on said doped hydrogenated amorphous silicon layer; and
   etching in said dry etching device said doped hydrogenated amorphous silicon layer and said hydrogenated amorphous silicon active layer;
   said step of selectively etching said metal layer includes a step of simultaneously forming a source electrode and a drain electrode;
   said metal layer containing molybdenum;
   said step of selectively etching said metal layer includes a step of, while etching, tapering at an angle side walls of said metal layer.

8. The TFT fabrication method according to claim 7, in which said step of selectively etching said metal layer includes a reactive ion etching step employing as reactive gases a chlorine containing gas and oxygen.

9. The TFT fabrication method according to claim 7, in which said step of selectively etching said metal layer includes a reactive ion etching step employing as reactive gases a bromine containing gas and oxygen.

10. The TFT fabrication method according to claim 7, in which said step of selectively etching said metal layer includes a step of etching said metal layer on said doped hydrogenated amorphous silicon layer at a ratio that is equal to or greater than 3 to 1.

11. The TFT fabrication method according to claim 7, in which said angle of said tapering is substantially 45â±25â.

12. The TFT fabrication method according to claim 7, in which said doped hydrogenated amorphous silicon layer is an n type hydrogenated amorphous silicon layer.

13. The TFT fabrication method according to claim 7, in which said step of selectively etching said metal layer includes a step of performing etching under the following conditions:
   a flow rate for a gas selected from the group consisting of chloric and bromic gas of 100 to 500 SCCM, a flow rate of oxygen of 30 to 150 SCCM, a flow rate of a gas selected from the group consisting of helium and argon of 100 to 500 SCCM, a pressure in the range from 20 to 400 mTorr and a radio-frequency (RF) power density in the range from 0.5 to 1.0 W/cm$^2$.

* * * * *